(12) United States Patent
Toyoshima et al.

(10) Patent No.: US 11,683,986 B2
(45) Date of Patent: Jun. 20, 2023

(54) THERMOELETRIC CONVERSION DEVICE

(71) Applicant: ASAHI FR R&D CO., LTD., Saitama (JP)

(72) Inventors: Syuhei Toyoshima, Saitama (JP); Syo Mihara, Saitama (JP); Koichi Abe, Saitama (JP)

(73) Assignee: ASAHI FR R&D CO., LTD., Saitama (JP)

( * ) Notice: Subject to any disclaimer, the term of this patent is extended or adjusted under 35 U.S.C. 154(b) by 0 days.

(21) Appl. No.: 16/763,951

(22) PCT Filed: Nov. 13, 2017

(86) PCT No.: PCT/JP2017/040701
§ 371 (c)(1),
(2) Date: May 13, 2020

(87) PCT Pub. No.: WO2019/092876
PCT Pub. Date: May 16, 2019

(65) Prior Publication Data
US 2020/0388740 A1 Dec. 10, 2020

(51) Int. Cl.
*H10N 10/17* (2023.01)
(52) U.S. Cl.
CPC ................... *H10N 10/17* (2023.02)
(58) Field of Classification Search
None
See application file for complete search history.

(56) References Cited

U.S. PATENT DOCUMENTS

| 6,121,539 A | * | 9/2000 | Johnson | H01L 23/38 |
| | | | | 136/203 |
| 6,274,648 B1 | | 8/2001 | Meguriya et al. | |

(Continued)

FOREIGN PATENT DOCUMENTS

| EP | 3 244 460 A1 | 11/2017 |
| JP | 2000-286463 A | 10/2000 |

(Continued)

OTHER PUBLICATIONS

Mar. 18, 2020 Office Action issued in Japanese Patent Application No. 2016-108940.

(Continued)

*Primary Examiner* — Dustin Q Dam
(74) *Attorney, Agent, or Firm* — Oliff PLC

(57) ABSTRACT

A thermoelectric conversion device includes: a thermoelectric module layer, in which a thermoelectric conversion chip is surrounded by a thermal insulation rubber containing a rubber component and a hollow filler forming a plurality of air gaps that are independent from one another; an insulation base layer and an insulation intermediate layer, which are thermal-conductive insulation sheets and sandwiches the thermoelectric module layer; a heat diffusion layer, which has a higher thermal conductance than those of the insulation base layer and the insulation intermediate layer and is stacked on the insulation intermediate layer; and a thermal radiation layer, which has thermal conductivity and is stacked on the heat diffusion layer. And at least one pair among the adjacent layers is bonded through chemical bonds.

8 Claims, 7 Drawing Sheets

(56) References Cited

U.S. PATENT DOCUMENTS

| | | | | |
|---|---|---|---|---|
| 6,530,231 | B1* | 3/2003 | Nagy | H01L 35/30 |
| | | | | 136/203 |
| 2013/0180354 | A1 | 7/2013 | Maranville et al. | |
| 2015/0194589 | A1* | 7/2015 | Roh | H01L 35/32 |
| | | | | 136/205 |
| 2015/0214461 | A1* | 7/2015 | Kurihara | H01L 35/16 |
| | | | | 257/467 |
| 2017/0352794 | A1* | 12/2017 | Takagi | B32B 25/20 |
| 2018/0291237 | A1* | 10/2018 | Mitsuboshi | C09J 9/02 |
| 2019/0019934 | A1* | 1/2019 | Watanabe | H01L 35/24 |

FOREIGN PATENT DOCUMENTS

| | | |
|---|---|---|
| JP | 2003-008087 A | 1/2003 |
| JP | 2003-174203 A | 6/2003 |
| JP | 2004-291889 A | 10/2004 |
| JP | 2009-302168 A | 12/2009 |
| JP | 2011137160 A | 7/2011 |
| JP | 2014129511 A | 7/2014 |
| JP | 2014238547 A | 12/2014 |
| JP | 2015138657 A | 7/2015 |
| JP | 2017216352 A | 12/2017 |
| WO | 2014/064755 A1 | 5/2014 |
| WO | 2016/111359 A1 | 7/2016 |

OTHER PUBLICATIONS

May 26, 2020 Office Action issued in Japanese Patent Application No. 2019-551855.

Jan. 23, 2018 International Search Report issued in International Patent Application No. PCT/JP2017/040701.

Jan. 23, 2018 Written Opinion of the International Searching Authority issued in International Patent Application No. PCT/JP2017/040701.

Jun. 24, 2021 European Search Report issued in European Patent Application No. 17931096.6.

* cited by examiner (a)

(b)

THERMOELETRIC CONVERSION DEVICE

TECHNICAL FIELD

The present invention relates to a thermoelectric conversion device which comprises a thermoelectric module layer having a thermoelectric conversion chip and a thermal insulation rubber surrounding it and develops Peltier effect or Seebeck effect.

BACKGROUND OF THE ART

It is known that a thermoelectric conversion element pair consisting of a n-type semiconductor element and a p-type semiconductor element develops Peltier effect in which heat is generated at one extreme of the thermoelectric conversion element pair and heat is absorbed at another extreme thereof through applying voltage between both of the semiconductors, or Seebeck effect in which voltage is generated by temperature difference between one extreme of the thermoelectric conversion element pair and another extreme thereof. Specifically, a thermoelectric conversion chip provided with a plurality of thermoelectric conversion element pairs sandwiched by base substrates is used for a heat-generating source or a heat-cooling source of an equipment or an instrument such as a warming/refrigerating cabinet or a cooler for CPU (a central processing unit) by using Peltier effect.

As embodiments of thus thermoelectric conversion chip, Patent Document 1 discloses a thermoelectric conversion module, in which many thermoelectric conversion element pairs are connected and arranged in series electrically on a flexible insulation film such as a polymer film or a rubber sheet as a base substrate and output terminals are formed on a heat-generating extreme at one end thereof and a heat-absorbing extreme at another end thereof. Since the thermoelectric conversion module can be vented or twisted, it can be installed onto not only a plat surface but also a curved surface of an equipment or an instrument.

As embodiments in which a thermoelectric conversion chip such as the thermoelectric conversion module of Patent Document 1 is used on a curved surface of an equipment, Patent Document 2 discloses embodiments in which a plurality of divided thermoelectric conversion chips is installed along a ring portion of a steering wheel for vehicles. An operator can handle the steering wheel by gripping the ring portion without feeling cold or heat at cold days or an extremely hot days, since the ring portion is heated or cooled by the thermoelectric conversion chip. Thus, the thermoelectric conversion chip having flexibility can be used for an equipment etc. which is directly touched by an operator.

The thermoelectric conversion chip is incorporated into a thermoelectric conversion device to be installed into an equipment or instrument. As shown in FIG. 7, in a thermoelectric conversion device 60 of the prior arts, a thermoelectric conversion chip 61 is sandwiched between a base-substrate-side sheet 64 made from rubber and an exposed-side sheet 65 to be arranged. The base-substrate-side sheet 64 is fixed on an equipment substrate 67, thereby the thermoelectric conversion device 60 of the prior arts is installed into the equipment etc.

A gap between the exposed-side sheet 65 and the equipment substrate 67 is a cavity 66. When heat generated at the heat-generating extreme 62 is conducted to the heat-absorbing extreme 63, thermoelectric conversion element pairs 61a not only cause a decline of heat-generation/heat-absorption efficiencies remarkably but also intercepts moving of carrier between the semiconductors to be destroyed finally. Therefore, in the thermoelectric conversion device 60 of the prior arts, air in the cavity 66 insulates the heat-generating extreme 62 and the heat-absorbing extreme 63 of the thermoelectric conversion element pair from heat. As shown a white allow in FIG. 7, when the exposed-side sheet 65 on the cavity 66 is pressed, the exposed-side sheet 65 is supported by the thermoelectric conversion chip 61 to be warped toward the cavity 66. Therefore, an upper surface of the thermoelectric conversion device 60 of the prior arts is deformed in the form of bumps and dips.

When the thermoelectric conversion device 60 of the prior arts is installed into an instrument such as a ring portion of a steering wheel which is directly touched by a user, thus deformation in the form of bumps and dips gives displeasure to the user due to the sense of defective touch. And a stress is converged to an edge of the thermoelectric conversion chip 61 by the bumps and dips, whenever the exposed-side sheet 65 is pressed. Thereby, the exposed-side sheet 65 is torn to be broken, or a thermoelectric conversion function is impaired because the edge of the thermoelectric conversion chip 61 is worn down. Further, the heat generated by the thermoelectric conversion chip 61 is remained just over the thermoelectric conversion chip 61 in the exposed-side sheet 65, because the exposed-side sheet 65 made from rubber has poor thermal conductivity. Therefore, the heat does not diffuse to whole surface of the exposed-side sheet 65 evenly, and the deviation of temperature distribution thereof occurs.

PRIOR ART DOCUMENT

Patent Document

[Patent Document 1] Japanese Patent Application Publication No. 2000-286463A
[Patent Document 2] Japanese Patent Application Publication No. 2004-291889A

SUMMARY OF THE INVENTION

Problems to be Solved by the Invention

The present invention was made in view of solving the above described problems, and its object is to provide a thermoelectric conversion device which can diffuse heat uniformly on the surface thereof, can thermally insulate a heat-generating extreme and a heat-absorbing extreme of a thermoelectric conversion element pair without giving rise to deformation in the form of bumps and dips due to application of pressure, and has high durability owing to high strength of bonding with the sheets sandwiching a thermoelectric conversion chip.

Means for Solving Problems

A thermoelectric conversion device of the present invention developed to achieve the objects described above comprises:
a thermoelectric module layer, in which a thermoelectric conversion chip is surrounded by a thermal insulation rubber containing a rubber component and a hollow filler forming a plurality of air gaps that are independent from one another; an insulation base layer and an insulation intermediate layer, which are thermal-conductive insulation sheets and sandwiches the thermoelectric module layer; a heat diffusion layer, which has a higher thermal conductance than those of the insulation base layer and the insulation intermediate layer and is stacked on the insulation intermediate layer; and a thermal radiation layer, which has thermal conductivity and is stacked on the heat diffusion layer. And at least one pair among the adjacent layers is bonded through chemical bonds.

As regards the thermoelectric conversion device, it is preferable that the hollow filler has a shell made from a resin, and heat-expandable liquid carbon hydride is encapsulated in the hollow of the shell.

In the thermoelectric conversion device, a thickness of the thermal insulation rubber and one of the thermoelectric conversion chip can be equal.

It is preferable that the heat diffusion layer of the thermoelectric conversion device is made from at least one selected from the group consisting of aluminum, copper, graphite, heat-transfer rubber, heat-transfer elastomer, and the thermal-conductive insulation sheet.

In the thermoelectric conversion device, it is preferable that a thickness of the heat diffusion layer is ranging from 0.01-0.5 mm.

The thermoelectric conversion chip of the thermoelectric conversion device may have a thermoelectric conversion element pair consisting of a n-type semiconductor element and a p-type semiconductor element, electrodes sandwiching a plurality of the thermoelectric conversion element pair, and an insulation sheet stacked and bonded on the electrodes.

In the thermoelectric conversion device, it is preferable that the rubber component is silicone rubber, and a silane coupling layer is provided on an exterior surface of the hollow filler.

The thermoelectric conversion device further comprises a circuit layer conducting to the thermoelectric conversion chip, which is provided between the thermoelectric module layer and the insulation intermediate layer.

Effects of the Invention

According to the thermoelectric conversion device of the present invention, the thermal insulation rubber having high adiabaticity due to the hollow filler included therein surrounds the thermoelectric conversion chip. Therefore, the thermoelectric conversion device does not cause loss of the heat generated on the thermoelectric conversion chip, and has high thermoelectric conversion efficiency. And the thermoelectric conversion device does not have cavities for adiabaticity. Therefore the thermoelectric conversion device does not causes to generate deformation in the form of bumps and dips due to the thickness of the thermoelectric conversion chip at the surface of the thermal radiation layer as the most outer layer of the thermoelectric conversion device, even if the thermoelectric conversion device is pressed.

Since the thermoelectric conversion device has simple structure in which a plurality of layers is laminated and bonded each other, it is able to be promptly manufactured with low costs and high yield.

According to thermoelectric conversion device, the heat generated on the thermoelectric conversion chip diffuses towards a surface direction by the heat diffusion layer having the high thermal conductivity. Therefore the temperature distribution of the surface of the thermal radiation layer can be uniform.

Since the bonded surfaces of respective laminated layers of the thermoelectric conversion device are strongly bonded through the chemical bonds, the layers do not separated each other when curving or twisting it and the thermoelectric conversion device has high durability while it can be installed on the curved surface of the equipment or instrument.

When the hollow filler of the thermoelectric conversion device has the shell made from the resin and the heat-expandable liquid carbon hydride encapsulated in the hollow thereof, the hollow filler which is homogeneously expanded by the heat forms an air gap having even diameter in the thermal insulation rubber. Therefore, the rubber component in the thermal insulation rubber does not occur uneven distribution, and the thermoelectric conversion device can achieve both of high adiabaticity by the air gap and high strength by even distribution of the rubber component.

When the rubber component is the silicone rubber and the silane coupling agent is applied onto the outer surface of the hollow filler, the thermoelectric conversion device indicates higher durability by the thermal insulation rubber having high strength by bonding both of them strongly.

When the thermoelectric conversion device has the circuit layer between the thermoelectric module layer and the insulation intermediate layer, the thermoelectric conversion chip in the thermoelectric module layer can be controlled to work on a desired timing or at desired temperature while the wires for the circuit layer are connected to the controlling device thereof.

MODE FOR CARRYING OUT THE INVENTION

Hereunder, embodiments to practice the present invention in detail will be explained, but the scope of the present invention is not restricted by these embodiments.

Figure 1:
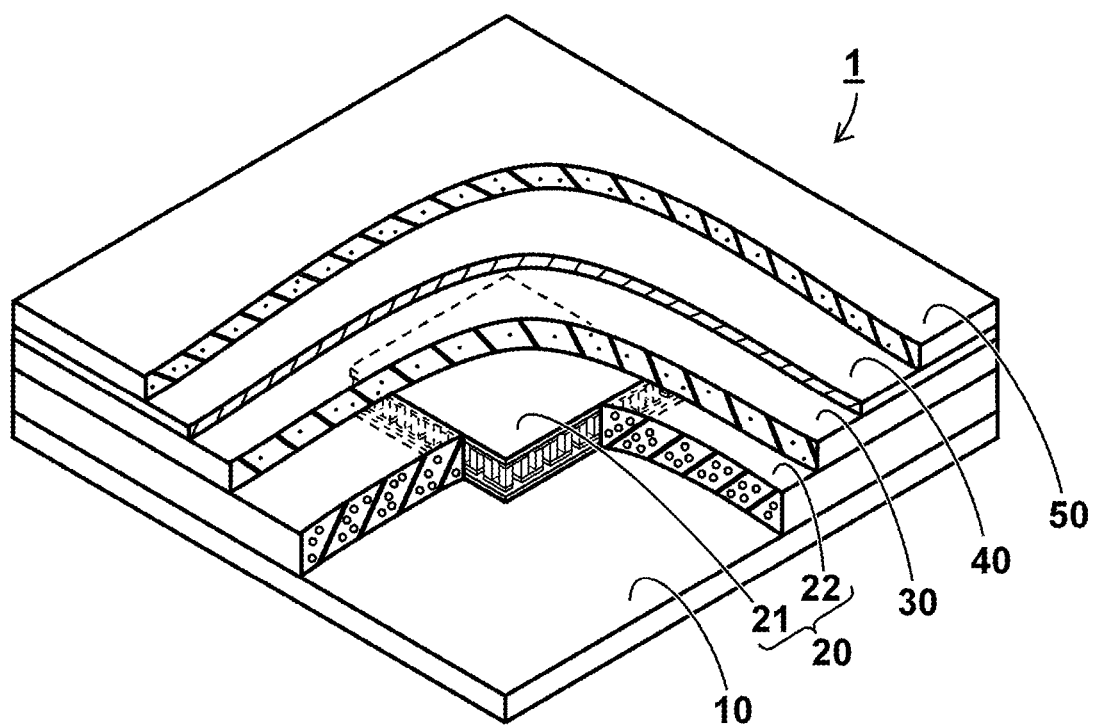
FIG. 1 is a schematic perspective view lacking a part, which indicates the thermoelectric conversion device that is applied with the present invention.

An embodiment of a thermoelectric conversion device 1 of the present invention is indicated in FIG. 1 which is a schematic perspective view lacking a part thereof. The thermoelectric conversion device 1 has an insulation base layer 10, a thermoelectric module layer 20, an insulation intermediate layer 30, a heat diffusion layer 40, and a thermal radiation layer 50, all which are overlapped and arranged in laminae in this order. A thermoelectric conversion chip 21 is arranged at a central portion of the thermoelectric module layer 20

The adjacent layers each other, namely a pair of the insulation base layer 10 and the thermoelectric module layer 20, a pair of the thermoelectric module layer 20 and the insulation intermediate layer 30, a pair of the insulation intermediate layer 30 and the heat diffusion layer 40, and a pair of the heat diffusion layer 40 and the thermal radiation layer 50, are respectively bonded through chemical bonds. Thus bonds are extremely strong unlike adhesion such as an adhesive agent or a tackiness agent which adhere through an intermolecular force or a physical anchor effect, because the layers are bonded each other through covalent bonds as chemical bonds. Therefore, the respective layers are not peeled off each other, when pressing, vending or twisting of the thermoelectric conversion device 1. And the heat generated on a thermoelectric conversion chip 21 does not cause a heat loss at an interlayer movement, because the heat moves between the interlayer without using the adhesive agent or the tackiness agent. Therefore, the thermoelectric conversion device 1 has high thermoelectric conversion efficiency.

The thermoelectric module layer 20 has the thermoelectric conversion chip 21 and a thermal insulation rubber 22 which surrounds the side of the thermoelectric conversion chip 21. The thermoelectric conversion chip 21 and the thermal insulation rubber 22 have same thickness each other.

Figure 2:
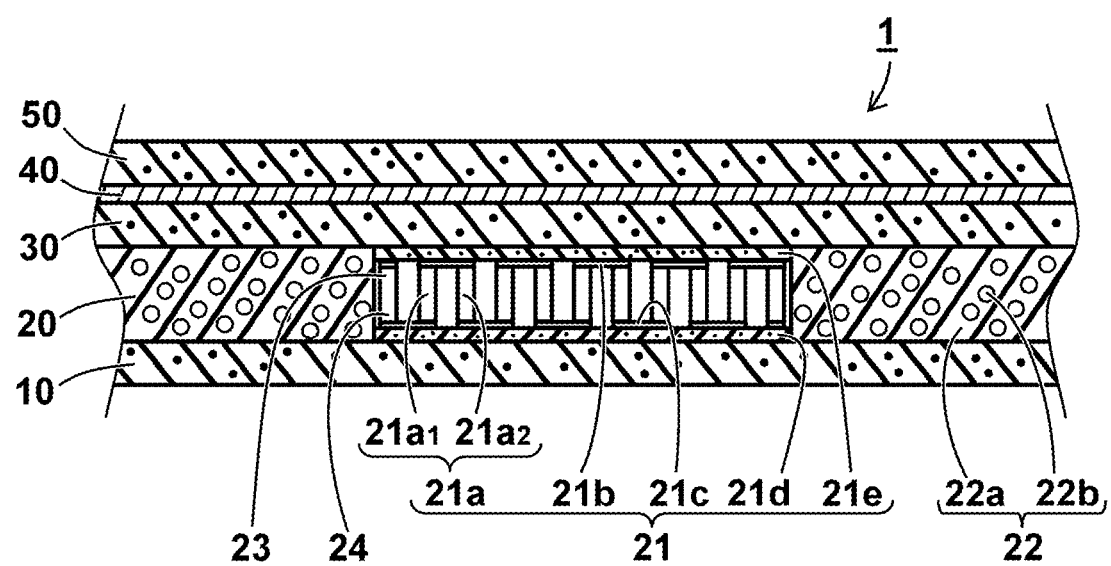
FIG. 2 is a schematic cross-section view, which indicates the thermoelectric conversion device that is applied with the present invention.

FIG. 2 indicates a schematic cross-section view of the thermoelectric conversion device 1. The thermal insulation rubber 22 includes a rubber component 22a and a hollow filler 22b which is homogenously dispersed in the rubber component 22a.

It is preferable that the rubber component 22a is silicone rubber. The silicone rubber has high flexibility and resistance of bending fatigue ability at wide temperature range such as −40° C. to 200° C. Therefore the thermoelectric conversion device 1 is able to be curved and installed along a curved surface of an equipment etc., and is also able to prevent expansion by heat-shock. It is preferable that number average molecular weight of the silicone rubber is ranging from 10,000 to 1,000,000. The hollow filler 22b forms in a shape of sphericity, and has a flexible shell made from thermoplastic resin which is exemplified with a vinylidene chloride resin or acryl resin and has a gas barrier property. A small amount of heat-expandable liquid carbon hydride is encapsulated in the hollow of the shell.

Almost volume of the hollow in the shell of the hollow filler 22b is occupied with air. Thereby, an air gap is formed by air in the thermal insulation rubber 22. Therefore, the thermal insulation rubber 22 has high adiabaticity as well as one of the air. So the thermoelectric conversion device 1 can perform the thermoelectric conversion with high efficiency, because the heat generated at a heat-generating extreme 23 of the thermoelectric conversion chip 21 does not diffuse to the thermal insulation rubber 22 and is conducted to the insulation intermediate layer 30 and the heat diffusion layer 40 and then is conducted to the thermal radiation layer 50 as the outmost layer effectively.

As such a hollow filler 22b, heat expandable microcapsules are preferable, in particular, MATSUMOTO MICROSPHERE (registered trademark), F, FN, F-E, F-DE, and MFL (trademark, available from Matsumoto Yushi-Seiyaku Co., Ltd); KUREHA Microsphere (trademark, available from KUREHA CORPORATION); Expancel (registered trademark, available from Japan Ferrite Co., Ltd.); ADVANCELL (registered trademark), EM, HB, and NS (trademark, available from SEKISUI CHEMICAL Co., Ltd.)

When the thermoelectric conversion chip 21 and the thermal insulation rubber 22 have the equal thickness, the thermoelectric module layer 20 forms in a shape of a rectangular parallelepiped having no bumps and no dips at all surfaces thereof. And the thermoelectric module layer 20 have no cavity around the thermoelectric conversion chip 21. Thereby, the upper surface of the thermoelectric conversion device 1 does not deform in the form of bumps and dips unlike thermoelectric conversion device of the prior arts, even if the thermal radiation layer 50 is applied with a pressure. Since the pressed force is not converged to an edge of the thermoelectric conversion chip 21 to be diffused, the thermal radiation layer 50 arranged on exposed surface does not peel off or the edge of the thermoelectric conversion chip is not worn down. Additionally, the sense of touch of the operator are not impaired, when the thermoelectric conversion device 1 is attached to a ring portion of a steering wheel of a vehicle.

And since the hollow filler 22b has the shell, particles of the hollow filler 22b are not joined and are independent each other. That is to say, the air gaps in the thermal insulation rubber 22 are not joined and are homogeneously dispersed in the rubber component 22a, and distance between the air gaps are approximately even in the thermal insulation rubber 22 thereby. When the thermoelectric conversion device 1 is curved or pressed, the stress is distributed in the rubber component 22 and the shock is absorbed because the rubber component 22a also can exist in the thermal insulation rubber 22 homogeneously thereby. Since the air gaps of the thermal insulation rubber 22 are formed by the hollow filler 22b having the flexible shell, they have not only elasticity by the rubber component 22a but also flexibility by the shell of the hollow filler 22b unlike a cellular rubber having a lot of mere air gaps. Accordingly, the thermal insulation rubber 22, in which the rubber component 22a and the hollow filler 22b are contiguous, does not form cracks or fractures by an external force such as pressed pressure, curving or twisting under repeat of heat-generating/heat-cooling. Furthermore, the air gaps in the thermal insulation rubber 22 prevent incursion of water from external environment to cavity, because the air gaps are formed by the hollow filler 22b. Thus, the thermal insulation rubber 22 has high strength and waterproofing property, and supports the thermoelectric conversion chip 21 by surrounding it. And the thermal insulation rubber 22 not only prevents damages and incursion of water but also gives high strength and resistance of bending fatigue ability to the thermoelectric conversion device 1.

A silane coupling layer containing a silane coupling agent may be attached to the outer surface of the hollow filler 22b. According to this, the rubber component 22a made from silicone rubber and the hollow filler 22b can be firmly bonded by molecular adhesion through a silane coupling agent. And the hollow filler 22b may include multiple types having different average particle sizes, materials, and expansion rates.

The molecular adhesion between the rubber component 22a and the hollow filler 22b as strong bonding, means that the rubber component 22a and the hollow filler 22b bond through single or multiple molecules of molecular adhesive agent molecules by a chemical reaction for covalent bonding between functional groups in the molecules of the molecular adhesive agent such as a silane coupling agent and the silicone rubber in the rubber component 22a as an adherend through the covalent bonds. The molecular adhesive agent has two kind of functional groups, and forms the covalent bonding through the chemical reaction between the rubber component 22a and the hollow filler 22b respectively. The molecule adhesive agent is a generic term used to refer to thus both-functional molecules.

As the molecular adhesive agent, specifically, a compound having an amino group such as triethoxysilylpropylamino-1,3,5-triazine-2,4-dithiol (TES), aminoethylaminopropyl trimethoxy silane;
a triazine compound having a trialkoxysilylalkylamino group such as a triethoxysilylpropylamino group, a mercapto group or an azide group, a triazine compound represented by the following Formula (1):

[Chemical Formula 1]

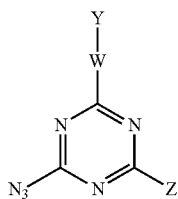

(1)

in Formula (1), wherein W is a spacer group e.g. may be the alkylene group, aminoalkylene group which optionally have a substituted group or may be directly bonded;
Y is an OH group or a reactive functional group which generates the OH group by hydrolysis or cleavage e.g. the trialkoxyalkyl group;
—Z is —$N_3$ or —$NR^1R^2$ ($R^1$ and $R^2$ are the same or different, and are H or an alkyl group, —$R^3Si(R^4)_m$ $(OR^5)_{3-m}$ [$R^3$ and $R^4$ are an alkyl group, $R^5$ is H or an alkyl group, m is 0 to 2], incidentally, the alkylene group, alkoxy group and alkyl group are the chained, branched and/or cyclic hydrocarbon group having 1 to 12 carbon atoms which optionally has a substituted group);
a thiol compound having a trialkoxysilylalkyl group;
an epoxy compound having a trialkyloxysilylalkyl group;
a silane-coupling agent such as a vinylalkoxysiloxane polymer exemplified by
$CH_2=CH—Si(OCH_3)_2—O—[Si(OCH_3)_2—O—]_n—Si(OCH_3)_2—CH=CH_2$ (n=1.8 to 5.7) are included.

As the silane-coupling agent, a silane-coupling agent such as a vinylalkoxysiloxane polymer; a silane-coupling agent containing an amino group having alkoxy group are included. Particularly, an alkoxysilyl compound containing the amino group exemplified by vinyltriethoxysilane (KBE-1003) N-2-(aminoethyl)-3-aminopropylmethyldimethoxysilane (KBM-602), N-2-(aminoethyl)-3-aminopropyltrimethoxysilane (KBM-603), N-2-(aminoethyl)-3-aminopropyltriethoxysilane (KBE-603), 3-aminopropyltrimethoxysilane (KBM-903), 3-aminopropyltriethoxysilane (KBE-903), 3-triethoxysilyl-N-(1,3-dimethyl-butylidene) propylamine (KBE-9103), N-phenyl-3-aminopropyltrimethoxysilane (KBM-573) and N-(vinylbenzyl)-2-aminoethyl-3-aminopropyltrimethoxysilane hydrochloride (KBM-575) (all of which is manufactured by Shin-Etsu Chemical Co., Ltd.; trade names) may be used. Further, an alkoxysilyl compound containing an amino group exemplified by 3-aminopropyltrimethoxysilane (Z-6610), 3-aminopropyltrimethoxysilane (Z-6611), 3-(2-aminoethyl)aminopropyltrimethoxysilane (Z-6094), 3-phenylaminopropyltrimethoxysilane (Z-6883), and N[3-(trimethoxysilyl)propyl]-N'-[(ethenylphenyl)methyl]-1,2-ethanediamine hydrochloride (Z-6032) (all of which is manufactured by Dow Corning Toray Co., Ltd.; trade names) may be suitably used.

A silicone rubber of the rubber component 22a is preferably a three-dimensional silicone rubber, specifically a additional crosslinking type silicone rubber, a peroxide crosslinking type silicone rubber, and a condensation crosslinking type silicone rubber. Further, non-silicone rubber may be used, or a co-blend of silicone rubber and non-silicone rubber may be used. The three-dimensional silicone rubber is obtained by putting these rubber raw material compositions in a molding die and crosslinking them.

The additional crosslinking type silicone rubber of the rubber component 22a can be obtained by synthesis using below composites in the presence of a Pt catalyst. As the composites, a composite containing polysiloxanes having a vinyl group and polysiloxanes having a H group is included. As polysiloxane having the vinyl group, vinylmethylsiloxane/polydimethylsiloxane copolymer (molecular weight: 500,000-900,000), vinyl-terminated polydimethylsiloxane (molecular weight: 10,000-200,000), vinyl-terminated diphenylsiloxane/polydimethylsiloxane copolymer (molecular weight: 10,000-100,000), vinyl-terminated diethylsiloxane/polydimethylsiloxane copolymer (molecular weight: 10,000-50,000), vinyl-terminated trifluoropropylmethylsiloxane/polydimethylsiloxane copolymer (molecular weight: 10,000-100,000), vinyl terminated polyphenylmethylsiloxane (molecular weight: 1,000-10,000), vinylmethylsiloxane/dimethylsiloxane copolymer, trimethylsiloxane group-terminated dimethylsiloxane/vinylmethylsiloxane/diphenylsiloxane copolymer, trimethylsiloxane group-terminated dimethylsiloxane/vinylmethylsiloxane/ditrifluoropropylmethylsiloxane copolymer and trimethylsiloxane group-terminated polyvinylmethylsiloxane are included. As polysiloxane having the H group, H-terminated polysiloxane (molecular weight: 500-100,000), methyl H siloxane/dimethylsiloxane copolymer, polymethyl H siloxane, polyethyl H siloxane, H-terminated polyphenyl(dimethyl H siloxy) siloxane, methyl H siloxane/phenylmethylsiloxane copolymer and methyl H siloxane/octylmethylsiloxane copolymer are included.

As other composites for synthesis of the addition type silicone rubber, a composite containing polysiloxanes having an amino group, and polysiloxanes having an epoxy group, polysiloxanes having an acid anhydride group or compounds having an isocyanato group. As polysiloxanes having the amino group, aminopropyl-terminated polydimethylsiloxane, aminopropylmethylsiloxane/dimethylsiloxane copolymer, aminoethylaminoisobutylmethylsiloxane/dimethylsiloxane copolymer, aminoethylaminopropylmethoxysiloxane/dimethylsiloxane copolymer and dimethylamino-terminated polydimethylsiloxane are included. As polysiloxanes having the epoxy group, epoxypropyl-terminated polydimethylsiloxane and (epoxycyclohexylethyl)methylsiloxane/dimethylsiloxane copolymer are included. As polysiloxanes having the isocyanato group, the acid anhydride group such as succinic acid anhydride-terminated polydimethylsiloxane and toluyldiisocyanate, and 1,6-hexamethylene diisocyanate are included.

The peroxide crosslinking type silicone rubber of the rubber component 22a is not specifically limited as far as the rubber synthesized from a silicone raw compound and crosslinked by a peroxide type crosslinking agent. Particularly, polydimethylsiloxane (molecular weight: 500,000-900,000), vinylmethylsiloxane/polydimethylsiloxane copolymer (molecular weight: 500,000-900,000), vinyl-terminated polydimethylsiloxane (molecular weight: 10,000-200,000), vinyl-terminated diphenylsiloxane/polydimethylsiloxane copolymer (molecular weight: 10,000-100,000), vinyl-terminated diethylsiloxane/polydimethylsiloxane copolymer (molecular weight: 10,000-50,000), vinyl-terminated trifluoropropylmethylsiloxane/polydimethylsiloxane copolymer (molecular weight: 10,000-100,000), vinyl-terminated polyphenylmethylsiloxane (molecular weight: 1,000-10,000), vinylmethylsiloxane/dimethylsiloxane copolymer, trimethylsiloxane group-terminated dimethylsiloxane/vinylmethylsiloxane copolymer, trimethylsiloxane group-terminated dimethylsiloxane/vinylmethylsiloxane/diphenylsiloxane copolymer, trimethylsiloxane group-terminated dimethylsiloxane/vinylmethylsiloxane/ditrifluoropropylmethyl iloxane copolymer, trimethylsiloxane group-terminated polyvinylmethylsyloxane, methacryloxypropyl group-terminated polydimethylsiloxane, acryloxypropyl group-terminated polydimethylsiloxane, (methacryloxypropyl)methylsiloxane/dimethylsiloxane copolymer, and (acryloxypropyl)methylsiloxane/dimethylsiloxane copolymer may be exemplified.

As the peroxide type crosslinking agent used for crosslinking, for example, ketone peroxides, diacyl peroxides, hydroperoxides, dialkylperoxides, peroxyketals, alkylperesters, percarbonates may be exemplified. More particularly, ketoneperoxide, peroxyketal, hydroperoxide, dialkylperoxide, peroxycarbonate, peroxyester, benzoylperoxide, dicumylperoxide, dibenzoylperoxide, tert-butylhydroperoxide, di-tert-butylhydroperoxide, di(dicyclobenzoyl)peroxide, 2,5-dimethyl-2,5-bis(tert-butylperoxy)hexane, 2,5-dimethyl-2,5-bis(tert-butylperoxy)hexyne, benzophenone, Michler's ketone, dimethylaminobenzoic acid ethyl ester and benzoin ethyl ether may be exemplified.

The amount of the peroxide type crosslinking agent can be arbitrarily determined depending on spacies of the silicone rubber or required functions and properties of the thermal insulation rubber 22. As the peroxide type crosslinking agent, preferably 0.01 to 10 parts by mass, more preferably 0.1 to 2 parts by mass relative to 100 parts by mass of silicone rubber can be preferably used. If the amount is less than this range, crosslink density is excessively low to give undesired properties as the silicone rubber. If the amount is more than this range, crosslink density is excessively high, and elasticity of the silicone rubber is decreased.

The condensation crosslinking type silicone rubber of the rubber component 22a can be obtained by synthesis using below composites. The composites of a homocondensation component consisting of silanol group-terminated polysiloxanes which is prepared in the presence of a tin catatlyst or a zinc catatlyst, a composite containing these silanol group-terminated polysiloxanes and crosslinking agents, and a composite containing these silanol group-terminated polysiloxanes, and terminal-blocked polysiloxanes exemplified by chloro-terminated polydimethyl siloxane, diacetoxymethyl-terminated polydimethyl siloxane, and terminated polysiloxane.

As silanol group-terminated polysiloxanes, silanol-terminated polydimethyl siloxane (molecular weight: 500-200,000), silanol-terminated polydiphenylsiloxane, silanol-terminated polytrifluoromethylsiloxane and silanol-terminated diphenyl siloxane/dimethylsiloxane copolymer are included. As the crosslinking agents, tetraacetoxysilane, triacetoxymethylsilane, di t-butoxydiacetoxysilane, vinyltriacetoxysilane, tetraethoxysilane, triethoxymethylsilane, bis(triethoxysilyl)ethane, tetra-n-propoxysilane, vinyltrimethoxysilane, methyltris(methylethylketoxim)silane, vinyltris(methylethylketoximino)silane, vinyltriisopropenoxysilane, triacetoxymethylilane, tri(ethylmethyl)oximmethylsilane, bis(N-methylbenzoamido)ethoxymethylsilane, tris(cyclohexylamino)methylsilane, triacetoamidomethylsilane and tridimethylamino methylsilane are included.

As non-silicone rubber of the rubber component 22a, butyl rubber, ethylene-propylene rubber, ethylene-propylene-diene rubber, urethane rubber, fluororubber, acrylic rubber, butadiene rubber, styrene-butadiene rubber, acrylonitrile-butadiene rubber, chloroprene rubber, isoprene rubber, natural rubber, 1,2-polybutadiene, styrene thermoplastic elastomer, olefin thermoplastic elastomer, polyester thermoplastic elastomer, and urethane thermoplastic elastomer may be exemplified. These may be used alone or in combination of two or more.

The thermoelectric conversion chip 21 has thermoelectric conversion element pairs 21a consisting of a n-type semiconductor element $21a_1$ and a p-type semiconductor element $21a_2$, a first electrode 21b and a second electrode 21c which sandwich both of the semiconductor elements $21a_1$ and $21a_2$ at an upper extreme and an under extreme thereof and contact each other electrically, and insulation sheets 21d and 21e which respectively cover both electrodes 21b and 21c and are contacted each other. The n-type semiconductor element $21a_1$ and the p-type semiconductor element $21a_2$ are contacted to the first electrode 21b each other at the upper extremes thereof by soldering with intervals. On the other hand, the n-type semiconductor element $21a_1$ among the thermoelectric conversion element pair 21a and the p-type semiconductor element $21a_2$ among another adjacent thermoelectric conversion element pair 21a are contacted to the second electrode 21c each other at the under extremes thereof by soldering with intervals. By repeat of connecting them, a plurality of the thermoelectric conversion element pairs 21a is arranged in series with patterning.

The thermoelectric conversion element pair 21a and both electrodes 21b and 21c are supported by the insulation sheets 21d and 21e. Thus, the n-type semiconductor element $21a_1$ and the p-type semiconductor element $21a_2$ are arranged with interval each other, and have so-called skeleton structure in which they are supported by the insulation sheets 21d and 21e. Thereby, the thermoelectric conversion chip 21 has flexibility. When the voltage is applied to thermoelectric conversion chip 21, the heat-generating extreme 23, which is located at the upper extreme of the thermoelectric conversion element pair 21a, generates the heat, and the heat-absorbing extreme 24, which is located at the under extreme thereof, cools the heat. The heat, which is generated at the heat-generating extreme 23 and is conducted to the insulation intermediate layer 30, does not move to the side of the heat-absorbing extreme 24 by interception because of the thermal insulation rubber 22 having high adiabaticity. Therefore, it prevents the decline of heat-generation/heat-absorption efficiencies due to conducting of the heat to the heat-absorbing extreme 24, or the damage of the thermoelectric conversion element pair 21a. Incidentally, number of the thermoelectric conversion element pair 21a in the thermoelectric conversion chip 21 may be adjusted according to the size, shape and output of the thermoelectric conversion device 1, and may be used as single or a plurality thereof.

The materials of both of the semiconductor elements of the thermoelectric conversion element pair are exemplified with a bismuth-tellurium-type thermoelectric conversion material such as Bi—Sb—Te—Se; a silicide-type thermoelectric conversion material such as Mn—Si and Mg—Si; a Si—Ge-type thermoelectric conversion material such as Si—Ge; an oxide-type thermoelectric conversion material such as $NaCo_2O_4$, $(Ca,Sr,Bi)_2Co_2O_5$, $(ZnO)_5(In—Y)_2O_3$, and (Zn—Al)O; a lead-tellurium-type thermoelectric conversion material such as PbTe; and a skutterudite-type thermoelectric conversion material such as Ce—Fe—Co—Sb, and b-Co-ptPb-Sb.

The thickness of the thermoelectric module layer 20 is preferably ranging from 0.1 to 5.0 mm, and is more preferably ranging from 1.0 to 2.0 mm. The thickness thereof is suitably adjusted according to the thickness of thermoelectric conversion chip 21. Incidentally, the thermoelectric module layer 20 may have a plurality of the thermoelectric conversion chips 21.

The insulation base layer 10 and the insulation intermediate layer 30, which sandwich the thermoelectric module layer 20 at the thickness direction thereof, are formed by thermal-conductive insulation sheets having the thermal conductivity and the electric insulation. Thereby, the heat movement after the heat-generation and the heat-absorption, which are occurred at the thermoelectric conversion chip 21 of the thermoelectric module layer 20, can accomplish with high efficiency. And a short circuit fault between both electrodes 21b and 21c and a current leakage are prevented.

The thermal-conductive insulation sheets, which form the insulation base layer 10 and the insulation intermediate layer 30, are made from a thermal-conductive insulation composition including a matrix and the thermal-conductive filler which is dispersed therein. The thermal-conductive insulation sheets as the insulation base layer 10 and the insulation intermediate layer 30 may be same or different each other. The thermal-conductive coefficient of the thermal-conductive insulation sheet is preferably 1 W/m·K or more, and is further preferably ranging from 1 to 5 W/m·K. If the thermal-conductive coefficient of the thermal-conductive insulation sheet is less than 1 W/m·K, the insulation base layer 10 and the insulation intermediate layer 30 having sufficient thermal conductivity are not obtained and the heat-generating/heat-absorbing efficiencies of the thermoelectric conversion device 1 are declined. Incidentally, the thermal-conductive coefficient is a value at 30° C.

And the thicknesses of the insulation base layer 10 and the insulation intermediate layer 30 are preferably ranging from 0.01 to 10 mm, and more preferably ranging from 0.05 to 2 mm. And the respective thicknesses of the insulation base layer 10 and the insulation intermediate layer 30 may be same or difference each other within this range. If the thickness thereof is less than 0.01 mm, handling in a manufacturing process of the thermoelectric conversion device 1 is inferior because of insufficient strength thereof. On the other hand, the thickness thereof is over 10 mm, the flexibility of the thermoelectric conversion device 1 is impaired and the thermal conductivity thereof becomes poor.

Examples of a matrix of the thermal-conductive insulation composition for the insulation base layer 10 and the insulation intermediate layer 30 are the silicone rubber and non-silicone rubber as well as one of the rubber component 22a. And Examples of the thermal-conductive filler are magnesium oxide (MgO), aluminum oxide ($Al_2O_3$), aluminum nitride (AlN), boron nitride (BN), silicon nitride ($Si_3N_4$), diamond, carbon, fullerene and graphite. The thermal-conductive filler may be in a single or in a plurality as combination of them. The content of the thermal-conductive filler in the thermal-conductive insulation sheet is preferably ranging from 50-95% by mass, and is further preferably ranging from 65-90% by mass.

Therefore, the heat diffusion layer 40, which is laminated onto the insulation intermediate layer 30, has higher thermal-conductive property than one of the insulation base layer 10 and the insulation intermediate layer 30. The heat is generated at the heat-generating extreme 23 of the thermoelectric conversion chip 21, and is moved to the insulation intermediate layer 30. The heat diffusion layer 40 can makes the heat move to a horizontal direction thereof efficiently and smoothly, and can make it diffuse to whole thermal radiation layer 50 evenly. Thereby, the temperature of the surface of the thermal radiation layer 50 rises evenly and homogeneously.

As a material of the heat diffusion layer 40, aluminum (270 w/m·K (30° C.)), copper (400 w/m·K (30° C.)), graphite (130 w/m·K (30° C., a planar direction)), and a thermal-conductive rubber/ thermal-conductive elastomer (5-10 w/m·K (30° C.)) etc. are exemplified. And for a material of the heat diffusion layer 40, the thermal-conductive insulation sheet as the material of the insulation base layer 10 and the insulation intermediate layer 30 may be used. Those materials may be used as in a single or in a plurality with overlapping or arranging thereof. The thickness of the heat diffusion layer 40 is preferably ranging from 0.01 to 0.5 mm, and is further ranging from 0.05 to 0.3 mm. In the case when the heat diffusion layer 40 is made from a metal material such as aluminum or copper with the above-mentioned thickness, the heat diffusion layer 40 does not impair the flexibility of the thermoelectric conversion device 1, supports the respective layers 10, 20, 30 and 50 by stiffness of the metal material, and can improve the resistance of bending fatigue ability of the thermoelectric conversion device 1.

The thermal radiation layer 50, which is laminated on the heat diffusion layer 40, makes the moving heat move from the heat diffusion layer 40 to the object to be heated. Therefore, the material for the thermal radiation layer 50 preferably has high thermal conductivity. The specific example thereof is the thermal conductive insulation composition which is the material of the he insulation base layer 10 and the insulation intermediate layer 30. Since the thermal radiation layer 50 is exposed on the surface of the equipment or instrument or is directly touched by the operator of the equipment and so on, preferably the material thereof is easy to be processed and does not impair the design the equipment and so on or the sense of touch of the operator. The material of the thermal radiation layer 50 is exemplified with not only a thermal-conductive insulation composition but also resins such as polyethylene, polypropylene and polyurethane, woven textile, non-woven fabric, lumber, and leather.

The thermoelectric conversion device 1 is manufactured as follows.

First of all, a rubber material composition, which becomes the rubber component 22a of the thermal insulation rubber 22, and the hollow filler 22b which is preliminarily applied with or immersed into the molecular adhesive agent and is covered by the molecular adhesive agent thereby, are kneaded. The hollow filler 22b, which has not yet heated, has a sharp particle-size distribution ranging from 5 to 50 μm of the average particle size thereof. And its outer shape is approximately spherical. Since the hollow filler 22b has even particle size and outer shape, it disperses in the rubber material composition by kneading homogeneously. The content by percentage of the hollow filler 22b in the thermal insulation rubber 22 is preferably 5 to 60 weight % by mass, and is more preferably 15 to 50 weight % by mass, and is further preferably 20 to 30 weight % by mass. If the content by percentage of the hollow filler 22b is too low, the rubber component 22 having sufficient adiabaticity and flexibility can not be obtained. On the other hand, if the content by percentage of the hollow filler 22b is too high, the thermal insulation rubber 22 impairs the strength thereof and is easy to form cracks or fractures.

Next, while a specified amount of the kneaded composition is put and heated in a mold kept at a specified temperature for a specified time, it is pressed to cast as to be same thickness with one of the thermoelectric conversion chip 21. Then the rubber material composition is hardened through crosslinking. In this time, the shell of the hollow filler 22b made from the flexible thermoplastic resin are softened by the heat. And then, the heat-expandable liquid carbon hydride encapsulated in the hollow of the shell changes into gas to increase volume thereof. The internal pressure of the hollow filler 22b is exceeded than the external pressure thereof, and the hollow filler 22b expands like a balloon to 50-100 times at the volume ratio. Since all shells of the hollow filler 22b is formed with same thickness, the hollow filler 22b has approximately equal expansion coefficient and the shell is spherical. Accordingly the pressure of the gassed heat-expandable liquid carbon hydride is given to whole shell uniformly. Thereupon, the air spaces having even shape and size are formed unlike bubbles having uneven shape and size which are formed by foaming, for example, through a foaming agent included in the rubber component. Incidentally, although the conditions of heating temperature and heating time are different according to a kind or property of the additional reaction, it is preferable that it is heated at 0 to 200° C. for 1 minute to 24 hours.

After specified time, the hardened material is ejected from the mold, and then is cooled. Then, the heat-expandable liquid carbon hydride in the hollow filler 22b becomes back into the liquid. And the shell maintained the size thereof when expanding. Thus the thermal insulation rubber 22, which has even size and evenly-dispersed air space, is formed. The thermal insulation rubber 22 is cut out by using a leaser cutter at specified position so as to have a desired size for which the thermoelectric conversion chip 21 is fitted. After the thermoelectric conversion chip 21 is put thereon to obtain the thermoelectric module layer 20.

After the thermal-conductive filler is added to the same rubber material composition, it is kneaded. The insulation base layer 10, the insulation intermediate layer 30 and the thermal radiation layer 50 are casted as well as manufacturing procedures of the thermal insulation rubber 22.

An aluminum sheet is cut out by a cutter so as to be same external size with respective layers 10, 20, 30 and 50 in order to form the heat diffusion layer 40.

A surface-activating treatment such as a corona discharge treatment, a plasma treatment, an ultraviolet irradiating treatment or an excimer treatment is carried out to one surface of the insulation base layer 10 and both surfaces of the thermoelectric module layer 20, in order to newly generate, amplify or expose hydroxyl groups as reactive functional groups thereon. The hydroxyl groups as the reactive functional groups are interspersed on the bonding surfaces of the insulation base layer 10 and the thermoelectric module layer 20 with original hydroxyl groups which are exposed on the bonding surface. Both layers 10 and 20 are fixed and placed face-to-face by using a jig (not shown) in order to be overlapped and contacted each other. They are pressed at high temperature to be crimped. Therefore, the hydroxyl groups form ether bonds directly through dehydration between them of respective layers 10 and 20. Accordingly both layers 10 and 20 are chemically bonded between both surfaces each other.

When the both layers 10 and 20 are bonded, they may be bonded through the covalent bonds under the atmospheric pressure or then may be bonded through the covalent bond under the atmospheric pressure, reduced pressure or a pressurization condition. Approaching between the reactive functional groups such as the hydroxy groups of the both layers 10 and 20 is enhanced by removing gaseous media of contact boundaries under the reduced pressure condition or a vacuum condition. As the reduced pressure condition or the vacuum condition, for example, 50 torr or less, more particularly, the reduced pressure conditions of 50 to 10 torr or the vacuum conditions of less than 10 torr, more particularly, less than 10 to $1 \times 10^{-3}$ torr, preferably less than 10 to $1 \times 10^{-2}$ torr. Alternatively, the approaching thereof may be enhanced by adding a stress (a load) of e.g. 10 to 200 kgf to the contact boundaries thereof, and further by heating the contact boundaries thereof.

As the treatment for the both layers 10 and 20, the corona discharge treatment is conducted under the conditions of e.g. power source: AC 100 V, output voltage: 0 to 20 kV, oscillating frequency: 0 to 40 kHz for 0.1 to 60 seconds, and temperature: 0 to 60° C. by using an apparatus for an atmospheric pressure corona surface modification (trade name of CoronaMaster; available from Shinko Electric & Instrumentation Co., Ltd.). The corona discharge treatment may be conducted to the face wetted with water, alcohols, acetones or esters etc.

A surface-activating treatment may be a atmospheric pressure plasma treatment. The atmospheric pressure plasma treatment is conducted under conditions of e.g. plasma processing speed: 10 to 100 mm/s, power source: 200 or 220 V AC (30 A), compressed air: 0.5 MPa (1 NL/min.), and 10 kHz/300 W to 5 GHz, electric power: 100 to 400 W, and irradiation period of time: 0.1 to 60 seconds by using an air plasma generator (trade name of Aiplasma; available from Panasonic Corporation).

A surface-activating treatment may be an ultraviolet irradiating treatment (General UV treatment such as ozone generation by UV irradiation or excimer UV treatment). The ultraviolet irradiating treatment is conducted under conditions of Integrated light intensity: 50 to 1500 mJ/cm$^2$, by using an excimer lamp light source(trade name of L11751-01; available from Hamamatsu Photonics Corporation).

Incidentally, the surface activating treatment may be carried out on the both surfaces of both layers 10 and 20 to be bonded, or may be carried out on only any one of them.

As similarly as above-mentioned procedures, after the surface-activating treatment is carried out onto both surfaces of the insulation intermediate layer 30, the insulation base layer 10 and the insulation intermediate layer 30 sandwich the thermoelectric module layer 20 and the overlapped intermediate layer 30 is pressed to be crimped, in order to be bonded each other. The heat diffusion layer 40 and the thermal radiation layer 50 are bonded as well as them to obtain the thermoelectric conversion device 1.

Although it is mentioned that the direct chemical bonding by the surface-activating treatment for bonding of the adjacent respective layers 10, 20, 30, 40 and 50 each other, thus bonding may be indirect bonding through a molecular adhesive agent.

As the molecular adhesive agent, the same kinds of silane coupling agent which is applied onto the externa surface of the hollow filler 22b may be used. In this case, in order to apply the molecular adhesive agent, it may be sprayed or coated onto the surface to be bonded of the respective layers 10, 20, 30, 40 and 50, or the thermal insulation rubber 22 and the respective layers 10, 30, 40 and 50 are immersed into the solution of the molecular adhesive agent.

As another examples of molecular adhesive agent, Reactive group-containing polysiloxane compound shown schematically in Formula (2) as following.

[Chemical Formula 2]

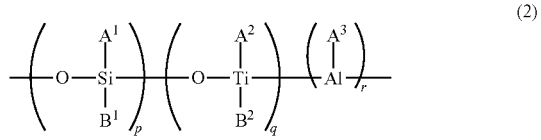

(2)

(In Formula (2), p and q are 0 or a number from 2 to 200, and r is 0 or a number from 2 to 100, and p+q+r>2. $-A^1$, $-A^2$ and $-A^3$ are selected from —$CH_3$, —$C_2H_5$, —CH=$CH_2$, —CH($CH_3$)$_2$, —$CH_2CH(CH_3)_2$, —C($CH_3$)$_3$, —$C_6H_5$ or —$C_6H_{12}$, and —$OCH_3$, —$OC_2H_5$, —OCH=$CH_2$, —OCH($CH_3$)$_2$, —$OCH_2CH(CH_3)_2$, —$OC(CH_3)_3$, —$OC_6H_5$, —$OC_6H_{12}$ and a reactive group capable of reacting with a hydroxy group. $-B^1$ and $-B^2$ are at least one selected from —N($CH_3$)$COCH_3$ or —N($C_2H_5$)$COCH_3$, and a reactive group capable of reacting with a hydroxy group such as —$OCH_3$, —$OC_2H_5$, —OCH=$CH_2$, —OCH($CH_3$)$_2$, —$OCH_2CH(CH_3)_2$, —$OC(CH_3)_3$, —$OC_6H_5$, —OC6$H_{12}$, —$OCOCH_3$, —$OCOCH(C_2H_5)C_4H_9$, —$OCOC_6H_5$, —ON=C($CH_3$)$_2$, —OC($CH_3$)=$CH_2$. When the layers 10, 20, 30, 40, 50 are bonded, they react with the hydroxy groups on the surface.) The repeating unit of this compound may be a block copolymer or a random copolymer.

In this case, the respective layers 10, 30, 40 and 50 and the thermal insulation rubber 22 are immersed in the solution of a reactive group-including polysiloxane which reacts with the hydroxyl groups, in order to apply it thereonto. And this solution is applied or sprayed on the outer surface of the insulation sheet 21d and 21e of the thermoelectric conversion chip 21. By subsequent heating treatment, the reactive group-including polysiloxane is bonded to the hydroxyl groups on the surfaces of the respective layers 10, 20, 30, 40 and 50 to form a molecular layer as a single layer. Accordingly, the reactive groups on the other layers to be bonded, which are bonded to the hydroxyl group, are amplified. The hydroxyl groups on either surface among respective layers 10, 20, 30, 40 and 50 are chemically bonded to the reactive group-including polysiloxane compound, and accordingly the hydroxyl groups on the respective layers 10, 20, 30, 40 and 50 are indirectly bonded each other through the reactive group-including polysiloxane to bond respective layers 10, 20, 30, 40 and 50 each other. When the reactive group-including polysiloxane compound is applied onto the thermoelectric conversion chip 21 and the thermal insulation rubber 22 simultaneously, it is preferable that the spraying treatment of the solution of the reactive group-including polysiloxane is performed instead of the immersing treatment thereof, and then the drying treatment, and the heating treatment if necessary. The reactive group-including polysiloxane compound may be applied onto the outer surface of the hollow filler 22b to form the silane coupling layer.

Incidentally, when it is not necessary that the heating/cooling effects by heating/cooling of the thermoelectric conversion chip 21 are accomplished on the side of the insulation base layer 10, the insulation base layer 10 may be made from a thermal insulation material or the insulation base layer 10 and the thermoelectric module layer 20 are adhered through an adhesive agent or a tackiness agent.

When the thickness of thermoelectric conversion chip 21 differs from one of the thermal insulation rubber 22, the thickness of thermoelectric conversion chip 21 portion may be adjusted as equal as the thermal insulation rubber 22 portion by piling up a spacer on the insulation sheets 21d or 21e.

For example, when the thermoelectric conversion device 1 is installed into the ring portion of the steering wheel for the vehicle or onto a bearing surface of a seat so that the thermal radiation layer 50 is faced outwards, it is used as the heat-generating source for a steering heater or a warm sheet. Or when the thermoelectric conversion device 1 is attached on an inside surface of a helmet or a protective clothing, it lightens the physical burden imposed on the operator who works in a cold place such as a freezing storage warehouse because it can warm inside of the protective clothing.

When the heat-absorbing extreme 24 in the thermoelectric conversion chip 21 is installed so as to be faced towards the thermal radiation layer 50, the thermoelectric conversion device 1 can achieve to generate the cooling phenomenon on the surface of the thermal radiation layer 50. In this case, when the thermoelectric conversion device 1 is attached into the ring portion of the steering wheel or inside a helmet or a protective clothing, it prevents rising inside temperature of the helmet or the protective clothing at a summer season or a hot place and it lightens the somatic burden imposed on the user due to hotness or heat and it avoids heat stroke or heat illness.

Thus, since the respective adjacent layers 10, 20, 30, 40 and 50 in the thermoelectric conversion device 1 are bonded each other through the chemical bonds strongly, the layers are not peeled off each other by vending it. And since the thermoelectric conversion chip 21 is surrounded by the thermal insulation rubber 22 having same thickness with one of the thermoelectric conversion chip 21 and the air spaces are not required for adiabaticity, the pressed force to the thermal radiation layer 50 does not cause to deform the surface of the thermal radiation layer 50 in the form of bumps and dips or to generate the damage of the thermoelectric conversion chip 21. Therefore, the thermoelectric conversion device 1 can be preferably used for the instruments etc. such as a steering wheel or a protective clothing, and it does not impair the sense of the user.

The thermoelectric conversion device 1 not only may be used as the heat-generating source or the heat-cooling source, but also may be used to generate a voltage by using Seebeck effect. In this case, while the thermal radiation layer 50 at the side of the heat-generating extreme 23 is contacted to a hot object, the insulation base layer 10 at the side of the heat-absorbing extreme 24 is contacted to a cold object. The thermoelectric conversion chip 21 generates the voltage by the temperature difference between the hot object and the cold object.

The thermoelectric conversion device 1 may have a circuit layer between the thermoelectric module layer 20 and the insulation intermediate layer 30. The circuit layer comprises wires by which the thermoelectric conversion chip 21 is electrically hooked up with a control device provided outside from the thermoelectric conversion device 1, for example. A part of the wire of the circuit layer is electrically continuous with the respective electrodes 21b and 21c of the thermoelectric conversion chip 21 through, for example soldering, while the other part of the wire is electrically connected with the control device. In this case, by a signal generated from the control device, the thermoelectric conversion device 1 can be worked according to a desired timing or temperature. The wire of the circuit layer can be formed by applying an electric conductor such as copper on the surface of the insulation intermediate layer 30 faced towards the thermoelectric module layer 20 through a printing procedure such as screen printing, flexographic printing, ink-jet printing, and offset printing.

Embodiments

Embodiments of the present invention will be described in detail below, but the scope of the present invention is not restricted to these embodiments.

Example 1

100 parts by mass of dimethyl silicone rubber (available from Wacker Asahikasei Silicone Co.,Ltd.; product name: 3320-20) as a rubber component 22a, 40 parts by mass of a heat-expandable microcapsules (available from Matsumoto Yushi-Seiyaku Co.,Ltd.; and consisting of each of 20 parts by mass of tradenames: Matsumoto Microsphere F-36-D (average particle size 13 μm) and F-36LVD (average particle size 16 μm)), and 0.1 parts by mass of a curing accelerator: a (available from Wacker Asahikasei Silicone Co., Ltd.; tradename: Cat.Ep) were kneaded. It was pressed and heated by a compression molding machine to be cured. The obtained hardened material was cut out by a leaser cutter. Thereby, the thermal insulation rubber 22 having a quadratic shapes of 50 mm square and 2 mm thickness was obtained. The central portion of the thermal insulation rubber 22 was cut out as a quadratic shapes of 4 mm square in order to make a hole in which a thermoelectric conversion chip 21 was put. When a thermal-conductive coefficient of the thermal insulation rubber 22 was measured according to JIS R2616-2000 by using a thermal-conductive coefficient meter (available from KYOTO ELECTRONICS MANUFACTURING CO., LTD.; tradename: QTM-500), the thermal-conductive coefficient was 0.44 w/m·K.

An aluminium sheet having thickness of 0.1 mm was cut out as a quadratic shapes of 50 mm square by a cutter to obtain a heat diffusion layer 40.

After magnesium oxide (MgO) and aluminum oxide ($Al_2O_3$) as a thermal-conductive filler was dispersed in dimethyl silicone rubber to obtain a composition for a flexible sheet such as an insulation base layer 10, an insulation intermediate layer 30, a thermal radiation layer 50 and insulation sheets 21d and 21e having thickness of 0.5 mm made from a thermal-conductive rubber. The composition was pressed and heated to cure, and obtained hardened material was cut out by a leaser cutter. Thereby, the insulation base layer 10, the insulation intermediate layer 30, and the thermal radiation layer 50 having a quadratic shapes of 50 mm square and 0.5 mm thickness were obtained. Similarly, the insulation sheets 21d and 21e having a quadratic shapes of 4 mm square and 0.5 mm thickness were obtained. When thermal-conductive coefficients of the respective layers 10, 30 and 50 and the insulation sheets 21d and 21e were measured as well as the thermal insulation rubber 22, the thermal-conductive coefficients thereof were 3.0 w/m·K.

After an ethanol solution of vinyl triethoxy silane (available from Shin-Etsu Chemical Co. Ltd., Silicones Division; tradename: KBE-1003) as a molecular adhesive agent was applied onto the outer surface of the insulation sheets 21d and 21e which sandwiched a plurality of the thermoelectric conversion element pairs 21a, they were heated and then washed with ethanol. Thereby, the thermoelectric conversion chip 21 having the insulation sheets 21d and 21e which are modified outer surfaces thereof was obtained.

The thermoelectric conversion chip 21, whose surface was modified, was put in the hole of the thermal insulation rubber 22 to make a thermoelectric module layer 20. A corona treatment was performed on to the surfaces of the respective layers 10, 20, 30, 40 and 50 to be bonded, and the hydroxyl groups were generated thereto. After the respective layers 10, 20, 30, 40 and 50 were piled in the order while the surface generating the hydroxyl groups were contacted each other. And then they were tucked by a jig. At this moment, the thermoelectric module layer 20 was arranged so that the heat-absorbing extreme 24 of the thermoelectric conversion chip 21 was placed at the side of the insulation intermediate layer 30, and then they were adhered by the molecular adhesive agent. Thereby, as shown in FIGS. 1 and 2, the thermoelectric conversion device 1 (width:length; height=50:50:2 mm) was obtained.

Comparative Example 1

An insulation base layer, a thermoelectric conversion chip and a thermal radiation layer were adhered by a molecular adhesive agent as well as Example 1 except for arranging no thermal insulation rubber for a thermoelectric module layer and piling up no insulation intermediate layer 30 and no heat diffusion layer 40. Thereby, a thermoelectric conversion device (width:length; height=50:50:2 mm) of Comparative Example 1 was obtained.

Table 1 indicates features of the structures of the thermoelectric conversion devices of Example 1 and Comparative Example 1.

TABLE 1

| Structure of Layers | | Example 1 | Comparative Example 1 |
| --- | --- | --- | --- |
| Thermal Radiation Layer | | Presence | Presence |
| Heat Diffusion Layer | | Presence | Absence |
| Insulation Intermediate Layer | | Presence | Absence |
| Thermoelectric Module Layer | Thermoelectric Conversion Chip | (Upper) Heat-absorbing Extreme (Under) Heat-generating Extreme | (Upper) Heat-absorbing Extreme (Under) Heat-generating Extreme |
| | Thermal Insulation Rubber | Presence | Absence |
| Insulation Base Layer | | Presence | Presence |

Heat-Absorption Controlling Temperature Distribution Test

Figure 3:
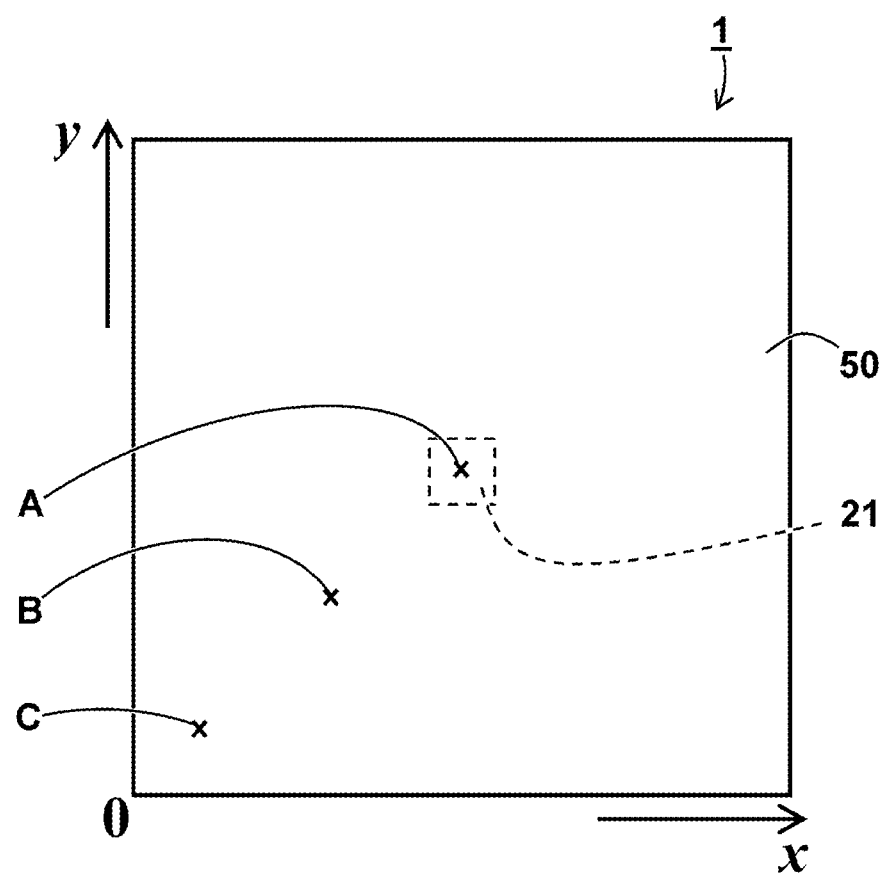
FIG. 3 is a plan view, which indicates locations of temperature measurement positions for a temperature distribution test and temperature change test using the thermoelectric conversion device that is applied with the present invention.
Figure 4:
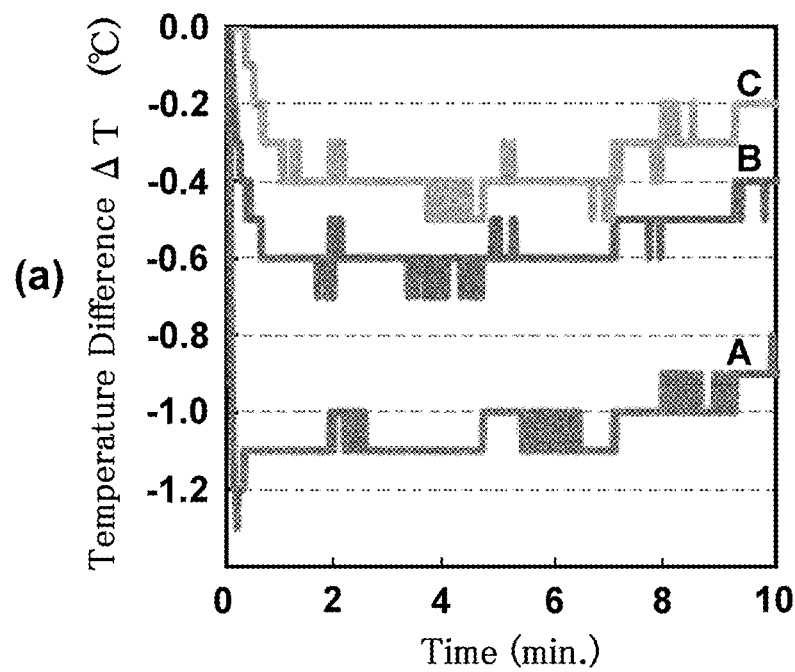
FIG. 4 is a graph, which indicates results of a heat-absorption controlling temperature distribution test for Example of the thermoelectric conversion device that is applied with the present invention and Comparative Example of a thermoelectric conversion device that is not applied with the present invention.
Figure 4:
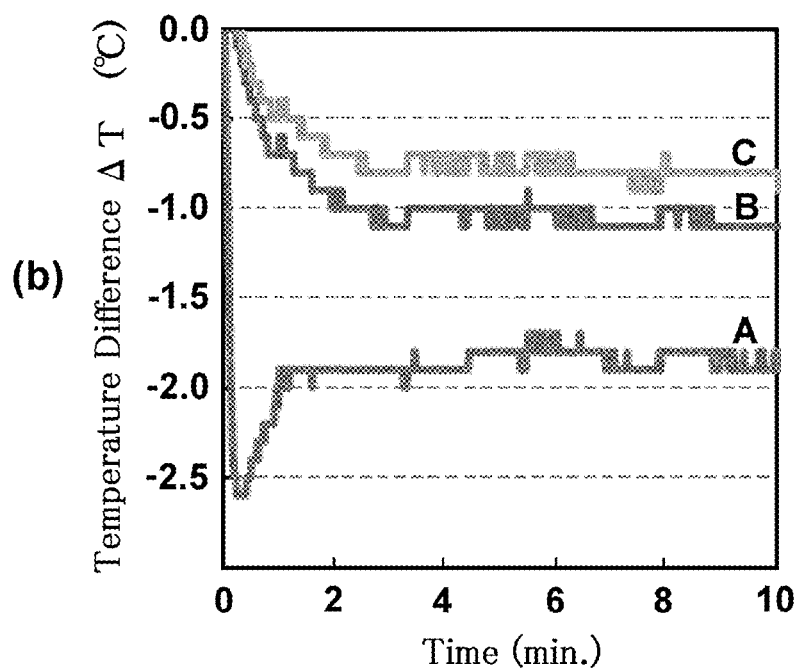

As shown in FIG. 3, thermocouples were set on positions of measurement points A-C on the surface of the thermal radiation layer 50 of the thermoelectric conversion device 1 of Example 1. Coordinates of each points were as follows; the measurement point A: x, y=25, 25 mm, the measurement point B: x, y=15, 15 mm, the measurement point C: x, y=5, 5 mm. The measurement point A was just above the thermoelectric conversion chip. A stabilized DC power supply was used. 0.45 V of the voltage was applied onto the thermoelectric conversion chip 21, and the side of the heat-absorbing extreme 24 was cooled thereby. The temperature results of the each measurement points were recorded by using a data logger. The temperature distribution test for Comparative Example was carried out as well as Example 1. FIG. 4 is a graph, which indicates the time courses of a temperature difference ΔT (° C.) of Example 1 and Comparative Example 1. The temperature difference ΔT (° C.) means a difference between the temperature at respective measurement point and room temperature, and it is represented by the following numerical expression (1).

$$\Delta T(° C.) = (\text{temperature at respective measurement point}) - (\text{room temperature}) \quad (1)$$

FIG. 4(a) indicates the results of Example 1, and FIG. 4(b) indicates the results of Comparative Example 1, respectively. In the graph, the horizontal axis indicates time (minutes) and the vertical axis indicates the temperature difference ΔT (° C.), respectively. Further, the temperatures after 5 minutes from starting application of the voltage are indicated in Table 2.

TABLE 2

| Measurement Point | Example 1 Temperature (° C.) after 5 min. | Example 1 Temperature Difference (° C.) from A | Comparative Example 1 Temperature (° C.) after 5 min. | Comparative Example 1 Temperature Difference (° C.) from A |
|---|---|---|---|---|
| A | 15.5 | — | 15.6 | — |
| B | 15.9 | 0.4 | 16.4 | 0.8 |
| C | 16.1 | 0.6 | 16.6 | 1.0 |

The thermoelectric conversion device of Example 1 indicates small temperature difference between each measurement points and even temperature distribution as compared with Comparative Example 1. The conversion device of Example 1 had excellent thermoelectric conversion efficiency and homogeneous temperature distribution due to having the heat diffusion layer.

Example 2

A thermoelectric conversion device of Example 2 was manufactured as well as Example 1 instead of preparing a thermoelectric module layer 20 so as to position a heat-generating extreme 23 of a thermoelectric conversion chip 21 on a side of an insulation intermediate layer 30.

Comparative Example 2

The thermoelectric conversion device of Comparative Example 1 was turned upside down and a thermocouple was put on a surface of an insulation base layer as a side of a heat-generating extreme of a thermoelectric conversion chip to manufacture a thermoelectric conversion device of Comparative Example 2.

Table 3 indicates features of the structures of the thermoelectric conversion device of Example 2 and Comparative Example 2.

TABLE 3

| Structure of Layers | | Example 2 | Comparative Example 2 |
|---|---|---|---|
| Thermal Radiation Layer | | Presence | Presence |
| Heat Diffusion Layer | | Presence | Absence |
| Insulation Intermediate Layer | | Presence | Absence |
| Thermoelectric Module Layer | Thermoelectric Conversion Chip | (Upper) Heat-generating Extreme (Under) Heat-absorbing Extreme | (Upper) Heat-generating Extreme (Under) Heat-absorbing Extreme |
| | Thermal Insulation Rubber | Presence | Absence |
| Insulation Base Layer | | Presence | Presence |

Heat-Generation Controlling Temperature Distribution Test

Figure 5:
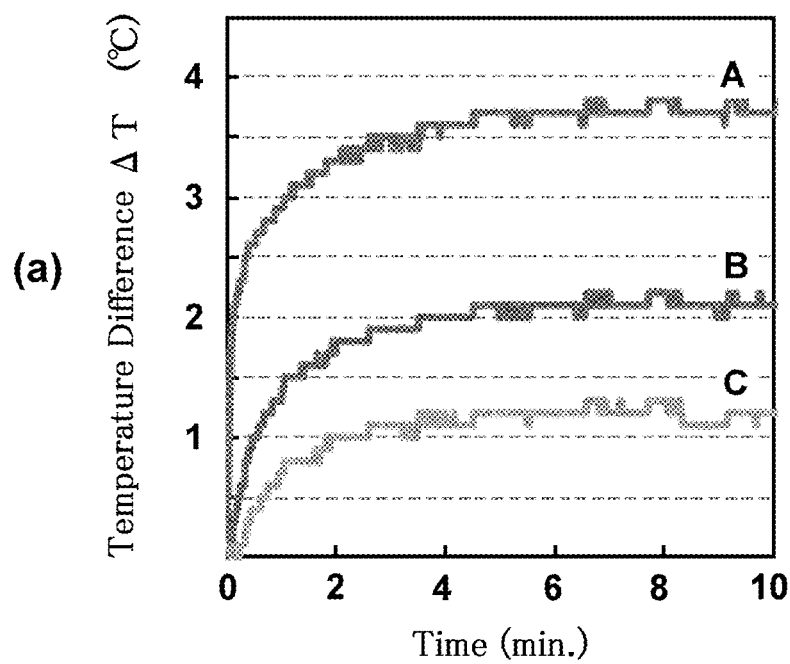
FIG. 5 is a graph, which indicates results of a heat-generation controlling temperature distribution test for Example of the thermoelectric conversion device that is applied with the present invention and Comparative Example of a thermoelectric conversion device that is not applied with the present invention.
Figure 5:
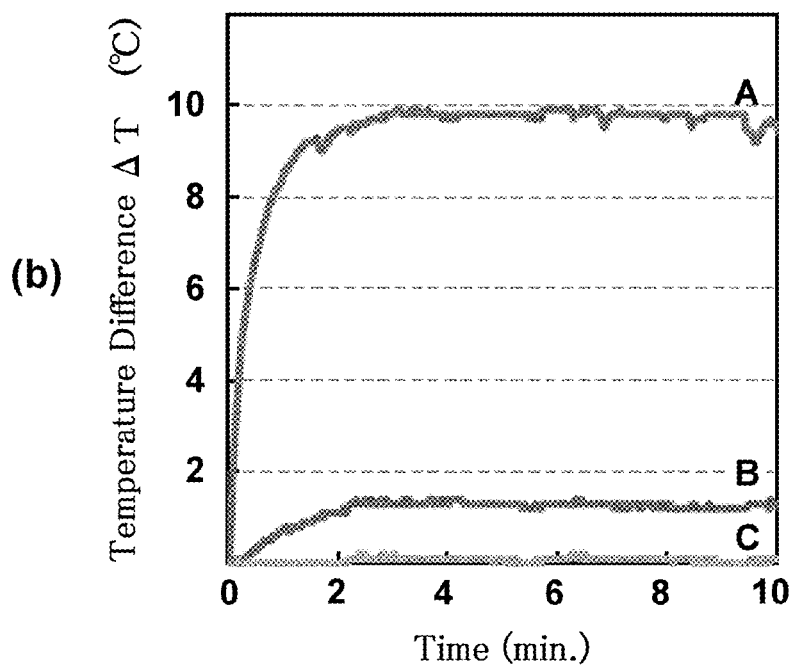

A voltage was applied onto the thermoelectric conversion chip of Example 2 as well as the procedures of the heat-absorption controlling temperature distribution test so as to generate heat at the side of the heat-generating extreme. Then the temperatures at the respective measurement points were measured, and the results of the temperature difference ΔT (° C.) were determined according to the numerical expression (1). The thermoelectric conversion chip of Comparative Example 2 was also measured as well as one of Example 1. The results of Example 2 are indicated in FIG. 5(a), and the results of Comparative Example 2 are indicated in FIG. 5(b), respectively. Further, the temperatures after 5 minutes from starting application of the voltage are indicated in Table 4.

TABLE 4

| Measurement Point | Example 2 Temperature (° C.) after 5 min. | Example 2 Temperature Difference (° C.) from A | Comparative Example 2 Temperature (° C.) after 5 min. | Comparative Example 2 Temperature Difference (° C.) from A |
|---|---|---|---|---|
| A | 20.1 | — | 26.5 | — |
| B | 18.5 | −1.6 | 18.0 | −8.5 |
| C | 17.6 | −2.5 | 16.0 | −10.5 |

The results showed that the thermoelectric conversion device of Example 2 had smaller temperature difference between the respective measurement points compared with one of Comparative Example 2 and indicated homogeneous temperature distribution. The thermoelectric conversion device of Example 2 had excellent thermoelectric conversion efficiency and homogeneous temperature distribution due to having the heat diffusion layer. On the other hand, as regards Comparative Example 1, only measurement point A just over the thermoelectric conversion chip indicated regional increase in temperature and homogeneous temperature distribution was not shown.

Comparative Example 3

A thermoelectric conversion device (width:length; height=50:50:2 mm) of Comparative Example 3, in which molecular adhesion was not applied, was manufactured as well as Example 1 except for using a thermoelectric module layer having the thermoelectric conversion chip without surface-modification and using a

Comparative Example 4

A thermoelectric conversion device (width:length; height=50:50:2 mm) of Comparative Example 4, in which a thermoelectric conversion chip was surrounded by air instead of the thermal insulation rubber, was obtained as well as Example 1 except for using no thermal insulation rubber for the thermoelectric module layer manufactured in Example 1.

Table 5 indicates features of the structures of the thermoelectric conversion devices of Example 1 and Comparative Examples 3 and 4.

TABLE 5

| Structure of Layers and Adhesion | | Example 1 | Comparative Example 3 | Comparative Example 4 |
|---|---|---|---|---|
| Thermal Radiation Layer | | Presence | Presence | Presence |
| Heat Diffusion Layer | | Presence | Presence | Presence |
| Insulation Intermediate Layer | | Presence | Presence | Presence |
| Thermoelectric Module Layer | Thermoelectric Conversion Chip | (Upper) Heat-absorbing Extreme (Under) Heat-generating Extreme | (Upper) Heat-absorbing Extreme (Under) Heat-generating Extreme | (Upper) Heat-absorbing Extreme (Under) Heat-generating Extreme |
| | Thermal Insulation Rubber | Presence | Presence | Absence |
| Insulation Base Layer | | Presence | Presence | Presence |
| Adhesion of respective Layers | | Molecular Adhesive Agent | Acryl Adhesive Agent | Molecular Adhesive Agent |

Heat-Absorption Controlling Temperature Change Test

Figure 6:
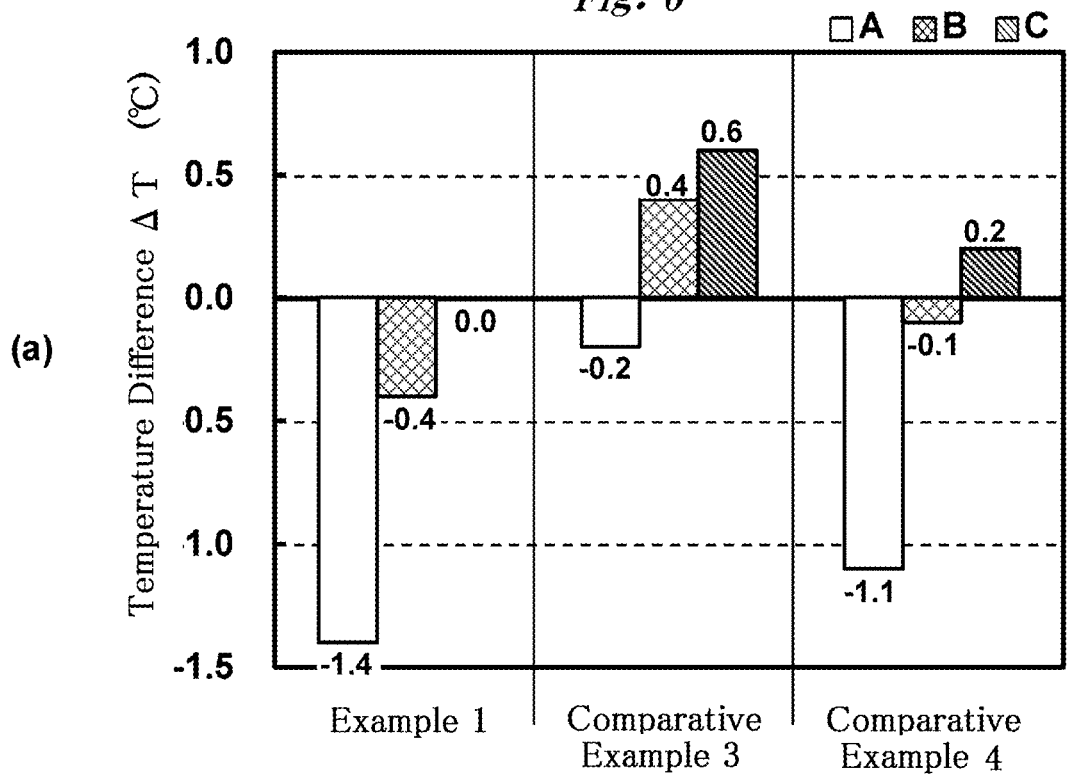
FIG. 6 is a graph, which indicates results of a heat-generation controlling temperature distribution test and a heat-absorption controlling temperature distribution test for Example of the thermoelectric conversion device that is applied with the present invention and Comparative Example of a thermoelectric conversion device that is not applied with the present invention.
Figure 6:
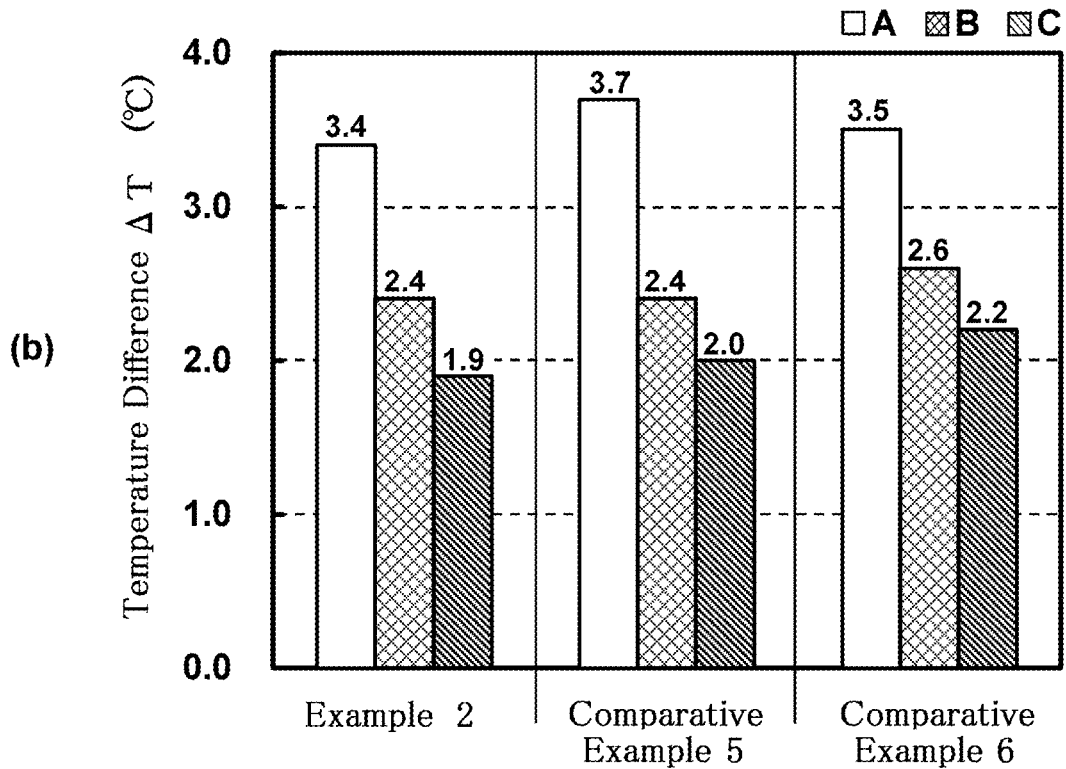
Figure 7:
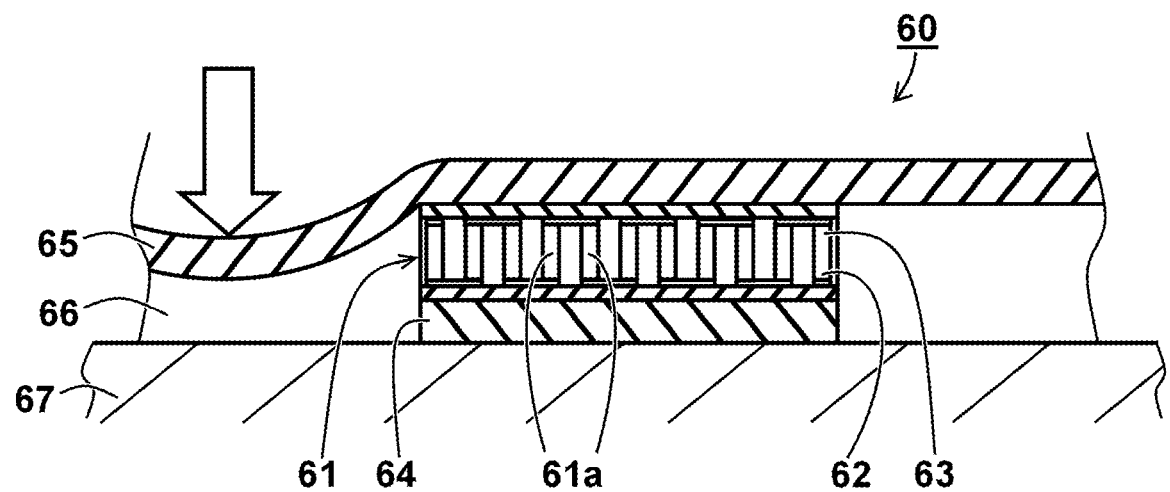
FIG. 7 is a schematic cross-section view, which indicates a thermoelectric conversion device of the prior arts.

The thermal radiation layers of the thermoelectric conversion devices of Example 1 and Comparative Examples 3 and 4 were cooled as well as the heat-absorption controlling temperature distribution test except for 0.6 V of an applied voltage. At respective measurement points A-C, the values of the temperature difference ΔT (° C.) after 5 minutes from starting application of the voltage were determined according to numerical expression (1). The results thereof are shown in FIG. 6(a). As shown in FIG. 6(a), Example 1 declined the temperature more drastically than Comparative Example 3 without applying the molecular adhesion. Therefore, it has turned out that the molecular adhesion inhibits a thermal-conductive loss between the layers and improves the thermoelectric conversion effect. And, since Example 1 indicated higher cooling effect than Comparative Example 4 having no thermal insulation rubber, thus thermal insulation rubber had the adiabaticity effect which was equal or more than air.

Comparative Example 5

A thermoelectric conversion device (width:length; height=50:50:2 mm) of Comparative Example 5, in which the molecular adhesion was not applied, was obtained as well as Example 2 except for using a thermoelectric module layer having a thermoelectric conversion chip without the surface modification and using an acryl adhesive agent to adhere the respective layers.

Comparative Example 6

A thermoelectric conversion device (width:length; height=50:50:2 mm) of Comparative Example 6, in which a thermoelectric conversion chip was surrounded by air instead of the thermal insulation rubber, was obtained as well as Example 1 except for using no thermal insulation rubber prepared in the thermoelectric module layer of Example 2.

Table 6 indicates features of the structures of the thermoelectric conversion device of Example 2 and Comparative Examples 5 and 6.

TABLE 6

| Structure of Layers and Adhesion | | Example 2 | Comparative Example 5 | Comparative Example 6 |
|---|---|---|---|---|
| Thermal Radiation Layer | | Presence | Presence | Presence |
| Heat Diffusion Layer | | Presence | Presence | Presence |
| Insulation Intermediate Layer | | Presence | Presence | Presence |
| Thermoelectric Module Layer | Thermoelectric Conversion Chip | (Upper) Heat-generating Extreme (Under) Heat-absorbing Extreme | (Upper) Heat-generating Extreme (Under) Heat-absorbing Extreme | (Upper) Heat-generating Extreme (Under) Heat-absorbing Extreme |
| | Thermal Insulation Rubber | Presence | Presence | Absence |
| Insulation Base Layer | | Presence | Presence | Presence |
| Adhesion of respective Layers | | Molecular Adhesive Agent | Acryl Adhesive Agent | Molecular Adhesive Agent |

Heat-Generation Controlling Temperature Change Test

The thermal radiation layers of the thermoelectric conversion devices of Example 2 and Comparative Examples 5 and 6 generated heat as well as the heat-absorption controlling temperature change test. At respective measurement points A-C, the values of the temperatures after 5 minutes from starting application of the voltage were measured, and the results of difference ΔT (° C.) were determined according to numerical expression (1). The results are shown in FIG. 6(b). As shown in FIG. 6(b), it has turned out that there was little difference between Example 2 and Comparative Example 5 without applying the molecular adhesion.

Presence and absence of the molecular adhesion do generate the difference in the heat-absorption controlling temperature change test, but do not generate the difference in the heat-generation controlling temperature change test. It seems that the reason thereof is as follows. First of all, the thermoelectric conversion device meets the following numerical expression (2).

$$Q_H > Q_C \quad (2)$$

In the numerical expression (2), $Q_H$ is an amount of heat generation on the thermal radiation layer, and $Q_C$ is an amount of heat absorption on the thermal radiation layer. $Q_H$ and $Q_C$, respectively include at least an amount ($Q_r$) of heat generation by an internal resistance of the thermoelectric conversion element pair, and a loss amount ($Q_\lambda$) of heat by the thermal-conductive resistance between the respective layers. Since $Q_r$ indicates a bigger value at high temperature and a smaller value at low temperature, the numerical expression (2) is always established. On the other hand, since $Q_\lambda$ has a low dependence property with the temperature, it deems that $Q_\lambda$ is constant.

In the heat-absorption controlling temperature change test, since the expression $Q_r < Q_\lambda$ is completed, $Q_\lambda$ contributes to $Q_C$ more than $Q_r$. Namely, the presence or absence of the molecular adhesion, which decline the thermal loss by the thermal-conductive resistance between the respective layers, generates difference of $Q_C$. On the other hand, in the heat-generation controlling temperature change test, since the expression $Q_r > Q_\lambda$ is completed, $Q_r$ contributes to $Q_H$ more than $Q_\lambda$. Namely, since the amount of heat generation by the internal resistance of the thermoelectric conversion element pair exceeds the loss amount of heat by the thermal-conductive resistance between the respective layers, the presence or absence of the molecular adhesion hardly generates the difference of $Q_H$.

As shown in FIG. 6(b), Example 2 having the thermal insulation rubber and Comparative Example 6 having no thermal insulation rubber indicate approximately equal heat-generation each other, it has turned out that the thermal insulation rubber has the adiabaticity effect which is equal or more than air.

INDUSTRIAL APPLICABILITY

The thermoelectric conversion device of the present invention does not generate the deformation in the form of bumps and dips on its surface by pressing, vending and twisting thereof. Therefore the thermoelectric conversion device can be used for a heat pump to be installed onto the curved surface of the equipment of the instrument which the user directly touches.

In the case when the thermoelectric conversion device is used and the voltage is applied to the thermoelectric conversion chip, the thermoelectric conversion device can be preferably used for the heat-generating source or the heat-cooling source of the equipment or the instrument such as the warming/refrigerating cabinet, the steering heater, and the warm seat by using Peltier effect in which one extreme of the thermoelectric conversion element pair generates heat-generation and other extreme thereof generates the heat-absorption respectively.

On the other hand, in the case when the thermoelectric conversion device is used and there is the temperature difference between both extremes of the thermoelectric conversion chip, the thermoelectric conversion device can be used for the generation of electrical energy for the devices such as the wrist watches which drive through a little electric power, by using Seebeck effect in which the voltage generates thereby.

EXPLANATIONS OF LETTERS OR NUMERALS

1: thermoelectric conversion device, 10: insulation base layer, 20: thermoelectric module layer, 21: thermoelectric conversion chip, 21a: thermoelectric conversion element pair, 21a$_1$: n-type semiconductor element, 21a$_2$: p-type semiconductor element, 21b: first electrode, 21c: second electrode, 1d, 21e: insulation sheet, 22: thermal insulation rubber, 22a: rubber component, 22b: hollow filler, 23: heat-generating extreme, 24: heat-absorbing extreme, 30: insulation intermediate layer, 40: heat diffusion layer, 50: thermal radiation layer, 60: thermoelectric conversion device of prior arts, 61: thermoelectric conversion chip, 61a: thermoelectric conversion element pair, 62: heat-generating extreme, 63: heat-absorbing extreme, 64: base-substrate-side sheet, 65: exposed-side sheet, 66: cavity, 67: equipment substrate, A, B, C: measurement point.

What is claimed is:
1. A thermoelectric conversion device comprising:
   a thermoelectric module layer comprising:
      a thermoelectric conversion chip, which has (i) a plurality of thermoelectric conversion element pairs each consisting of a n-type semiconductor element and a p-type semiconductor element, and (ii) electrodes sandwiching the plurality of thermoelectric conversion element pairs, and
      a thermal insulation rubber,
   an insulation base layer and an insulation intermediate layer, which are thermal-conductive insulation sheets and sandwich the thermoelectric module layer;
   a heat diffusion layer, which has a higher thermal conductance than those of the insulation base layer and the insulation intermediate layer and is stacked on the insulation intermediate layer; and
   a thermal radiation layer, which has thermal conductivity and is stacked on the heat diffusion layer,
   wherein the plurality of the thermoelectric conversion element pairs and the electrodes of the thermoelectric conversion chip are surrounded by the thermal insulation rubber as a pressurized thermal-cured product containing a rubber component and a hollow filler forming a plurality of expanded air gaps that are independent from one another,
   the thermoelectric conversion chip has an insulation sheet which is stacked and bonded to the electrodes,
   the hollow filler has a shell made from a flexible thermoplastic resin, the shell having a hollow, and heat-expandable liquid hydrocarbon is encapsulated in the hollow of the shell, the flexible thermoplastic resin is vinylidene chloride resin or acryl resin, the thermal insulation rubber includes a cut-out, the thermoelectric conversion chip is disposed inside of the cut-out such that the thermal insulation rubber is not present between any of the plurality of the thermoelectric conversion element pairs of the thermoelectric conversion chip, at least one pair among adjacent layers is bonded through chemical bonds, insulation sheets, which sandwich the plurality of the thermoelectric conversion element pairs, are applied by a molecular adhesive agent, respective layers of the insulation base layer, the thermoelectric module layer, the insulation intermediate layer, the heat diffusion layer, and the thermal radiation layer are piled in the order and bonded, and surfaces of the respective layers are corona-treated.

2. The thermoelectric conversion device according to claim 1, wherein a thickness of the thermal insulation rubber and a thickness of the thermoelectric conversion chip, in which the plurality of the thermoelectric conversion element pairs and the electrodes of the thermoelectric conversion chip are surrounded by the thermal insulation rubber, are equal.

3. The thermoelectric conversion device according to claim 1, wherein the heat diffusion layer is made from at least one selected from the group consisting of aluminum, copper, graphite, heat-transfer rubber, heat-transfer elastomer, and a thermal-conductive insulation sheet.

4. The thermoelectric conversion device according to claim 1, wherein a thickness of the heat diffusion layer is within a range from 0.01 mm to 0.5 mm.

5. The thermoelectric conversion device according to claim 1, wherein the rubber component is silicone rubber, and a silane coupling layer is provided on an exterior surface of the hollow filler.

6. The thermoelectric conversion device according to claim 1, further comprising a circuit layer conducting to the thermoelectric conversion chip, which is provided between the thermoelectric module layer and the insulation intermediate layer.

7. The thermoelectric conversion device according to claim 1, wherein
the thermoelectric conversion device is configured to generate heat, cool heat, or generate a voltage.

8. The thermoelectric conversion device according to claim 1, wherein the thermal insulation rubber is disposed outside of an outermost perimeter of the thermoelectric conversion chip in a width direction in which the thermal insulation rubber surrounds the plurality of the thermoelectric conversion element pairs and the electrodes.

* * * * *